(12) United States Patent
Yudovsky

(10) Patent No.: US 7,429,717 B2
(45) Date of Patent: Sep. 30, 2008

(54) MULTIZONE HEATER FOR FURNACE

(75) Inventor: Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 11/485,547

(22) Filed: Jul. 12, 2006

(65) Prior Publication Data

US 2008/0017628 A1  Jan. 24, 2008

(51) Int. Cl.
*F27B 5/14* (2006.01)
(52) U.S. Cl. .................. 219/390; 219/405; 219/411; 392/416; 392/418; 118/724; 118/725; 118/50.1
(58) Field of Classification Search .......... 219/390, 219/405, 411; 118/724, 725, 50.1; 392/416, 392/418
See application file for complete search history.

(56) References Cited

U.S. PATENT DOCUMENTS

| 5,947,718 | A | 9/1999 | Weaver |
| 6,083,625 | A | 7/2000 | Fiel et al. |
| 6,157,003 | A | 12/2000 | Drimer |
| 6,248,672 | B1 | 6/2001 | Takagi |
| 6,307,184 | B1 * | 10/2001 | Womack et al. ............. 219/390 |
| 6,399,923 | B2 | 6/2002 | Kano et al. |
| 6,496,648 | B1 * | 12/2002 | Mack et al. ................. 392/416 |
| 6,780,251 | B2 * | 8/2004 | Tometsuka ................. 118/725 |
| 7,027,722 | B2 | 4/2006 | Uemori et al. |

OTHER PUBLICATIONS

Metal Carbide Coatings on Graphite. "For Improved Performance in GaN and SiC Thin Film Equipment".Pub. No. 85501 Rev. 2 (Sep. 2003).
Advanced Material Solutions. "Chemically Vapor Deposited Products". Pub. No. 85506 (Aug. 2003).

* cited by examiner

*Primary Examiner*—Shawntina Fuqua
(74) *Attorney, Agent, or Firm*—Patterson & Sheridan, LLP

(57) ABSTRACT

The present invention relates to an apparatus and method for heating a semiconductor processing chamber. One embodiment of the present invention provides a furnace for heating a semiconductor processing chamber. The furnace comprises a heater surrounding side walls of the semiconductor processing chamber, wherein the heater comprises a plurality of heating elements connected in at least two independently controlled zones, and a shell surrounding the heater.

19 Claims, 7 Drawing Sheets

MULTIZONE HEATER FOR FURNACE

BACKGROUND OF THE INVENTION

1. Field of the Invention

Embodiments of the present invention generally relate to apparatus and method for heating a semiconductor processing chamber. Particularly, the present invention relates to a furnace having a multizone heater for heating a semiconductor processing chamber.

2. Description of the Related Art

Some processes during semiconductor processing are performed in a furnace where on or more substrates are processed in an elevated temperature. It is essential to heat the substrate or substrates uniformly, especially in a batch processing, a commonly used process step that can process two or more substrates simultaneously in one region. Batch processing has been proven to be effective in increasing device yield and reducing cost of ownership. A batch processing chamber generally processes a batch of vertically stacked substrates within a chamber volume. Process steps performed in a batch processing chamber, such as atomic layer deposition (ALD) and chemical vapor deposition (CVD), generally require substrates to be heated uniformly. Therefore, a batch processing chamber generally comprises a heating system configured to heat a batch of substrates. However, it is challenging to heat a batch of substrate uniformly and such a heating system may be complicated, difficult to maintain and costly to repair.

FIGS. 1 and 2 illustrate a heated batch processing chamber known in the art. FIG. 1 illustrates a batch processing chamber 100 in a processing condition. In this condition, a batch of substrates 102 supported by a substrate boat 101 is processed in a process volume 103 defined by a top 104, sidewalls 105, and a bottom 106. An aperture 122 formed in the bottom 106 provides a means for the substrate boat to be inserted into the process volume 103 or removed from the process volume 103. A seal plate 107 is provided to seal off the aperture 122 during a process.

Heating structures 110 are generally mounted on exterior surfaces of each of the sidewalls 105. Each of the heating structures 110 contains a plurality of halogen lamps 119 which are used to provide energy to the substrates 102 in the process volume 103 through a quartz window 109 mounted on the sidewall 105. Thermal shield plates 108 mounted on an inside surface of the sidewalls 105 are added to the process volume 103 to diffuse the energy emitted from the heating structures 110 to provide a uniform distribution of heat energy to the substrates 102.

The sidewalls 105 and the top 104 are generally temperature controlled by milled channels 116 (shown in FIG. 2) formed in the sidewalls 105 to avoid unwanted deposition and for safety reasons as well. When the quartz windows 109 are hot and the process volume 103 is under vacuum, undue stress would cause an implosion if the quartz windows 109 were in direct contact with the temperature controlled sidewalls 105. Therefore, O-ring type gaskets 124 (constructed of a suitable material such as, for instance, viton, silicon rubber, or cal-rez graphite fiber) and strip gaskets 123 of a similar suitable material are provided between the quartz windows 109 and sidewalls 105 to ensure that the quartz windows 109 do not come in direct contact with the sidewalls 105. The thermal shield plates 108 are generally mounted on the sidewalls 105 by insulating strips 125 and retaining clamps 126. The thermal shield plates 108 and the insulating strips 125 are made of a suitable high temperature material such as, for instance, graphite or silicon carbide. The retaining clamps 126 are made from suitable high temperature material such as titanium. The milled channels 116 formed in the sidewalls 105 may be temperature controlled by use of a heat exchanging fluid that is continually flowing through the milled channels 116.

The heating structures 110 are further described in U.S. Pat. No. 6,352,593, entitled "Mini-batch Process Chamber" filed Aug. 11, 1997, and U.S. patent application Ser. No. 10/216,079, entitled "High Rate Deposition At Low Pressure In A Small Batch Reactor" filed Aug. 9, 2002 which are incorporated herein by reference.

Referring now to FIG. 2, process gases used in depositing layers on substrates 102 are provided via a gas injection assembly 114. The gas injection assembly 114 is vacuum sealed to the sidewalls 105 via an O-ring 127. An exhaust assembly 115 is disposed on an opposite side of the gas injection assembly 114. The sidewalls 105, the top 104 and the bottom 106 are typically made of metals, such as aluminum.

The batch processing chamber 100 contains complicated system for heating, vacuum seal and thermal isolation. The heating structures 110 are difficult to assemble and service because special fixtures are required for removal and replacement. Furthermore, it would be difficult to control the heating uniformity using the heating structure 110.

Therefore, there is a need for a simplified heating system to heat a batch of substrates uniformly in a semiconductor processing chamber.

SUMMARY OF THE INVENTION

The present invention generally provides a method and apparatus for heating a batch processing chamber.

One embodiment of the present invention provides a furnace for heating a semiconductor processing chamber. The furnace comprises a heater surrounding the semiconductor processing chamber, wherein the heater comprises a plurality of heating elements connected in at least two independently controlled zones, and a shell surrounding the heater, wherein the heater is secured to the shell.

Another embodiment of the present invention provides a semiconductor processing system. The system comprises a chamber for processing substrates therein, a heater surrounding the chamber, wherein the heater has multiple independently controlled zones, a shell covering the heater, and a first reflector element disposed between the heater and the shell, wherein the heater, the first reflector element, and the shell are secured together.

Yet another embodiment of the present invention provides a furnace for a semiconductor processing chamber. The furnace comprises a printed circuit heater having multiple independently controlled zones configured to heat the semiconductor processing chamber, a reflector disposed outside the printed circuit heater, and a shell disposed outside the reflector, wherein the printed circuit heater, the reflector and the shell are secured together.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 illustrates a sectional top view of a state of the art processing system.

DETAILED DESCRIPTION

The present invention generally provides a semiconductor processing system having a multizone heater. The heater of in the present invention can accommodate a variety of control and wattage requirements depending on process temperatures and provide different heating power to different zones in a batch processing chamber. The invention is illustratively described below in reference to modification of a FLEX-STAR™ system, available from Applied Materials, Inc., Santa Clara, Calif.

Figure 1:
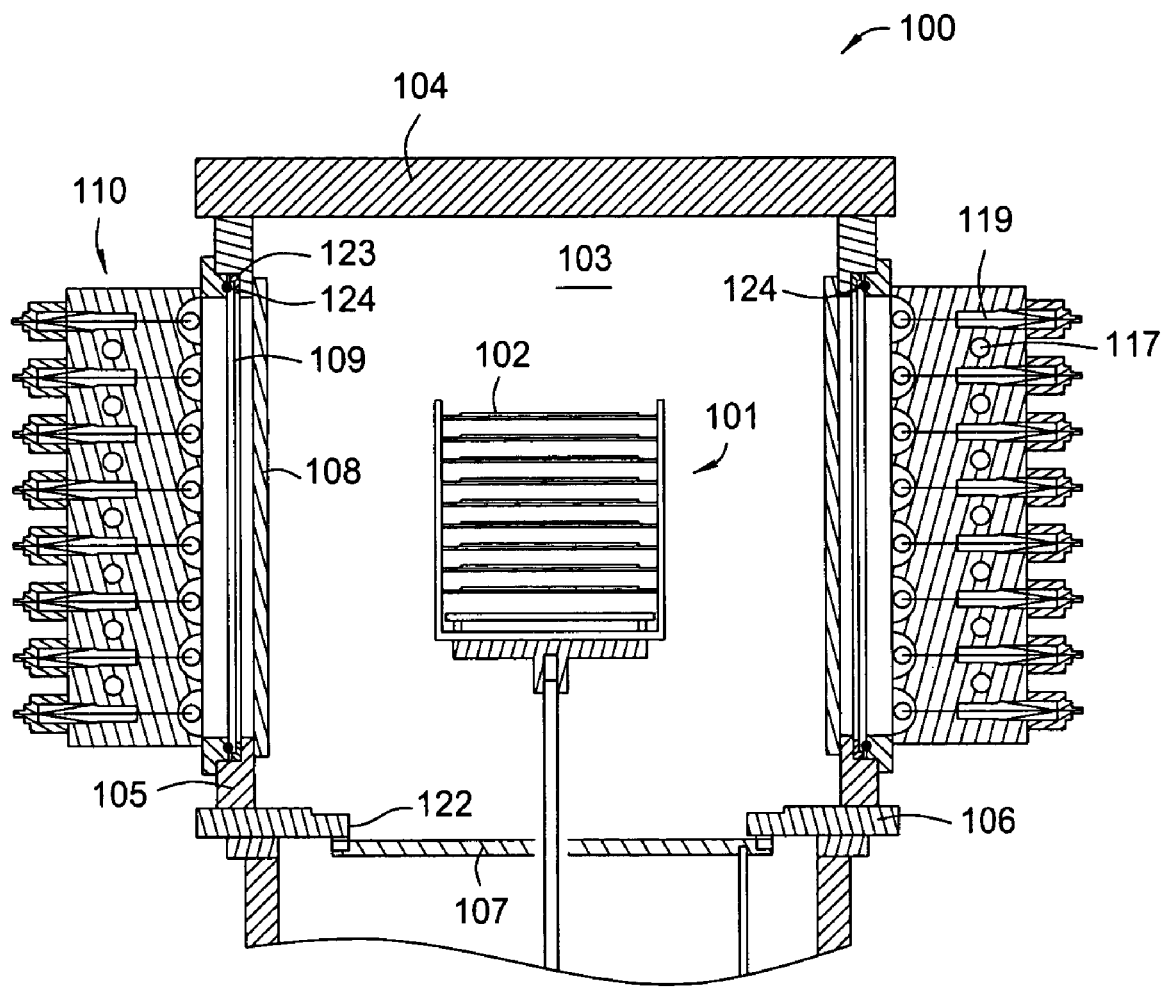
Figure 2:
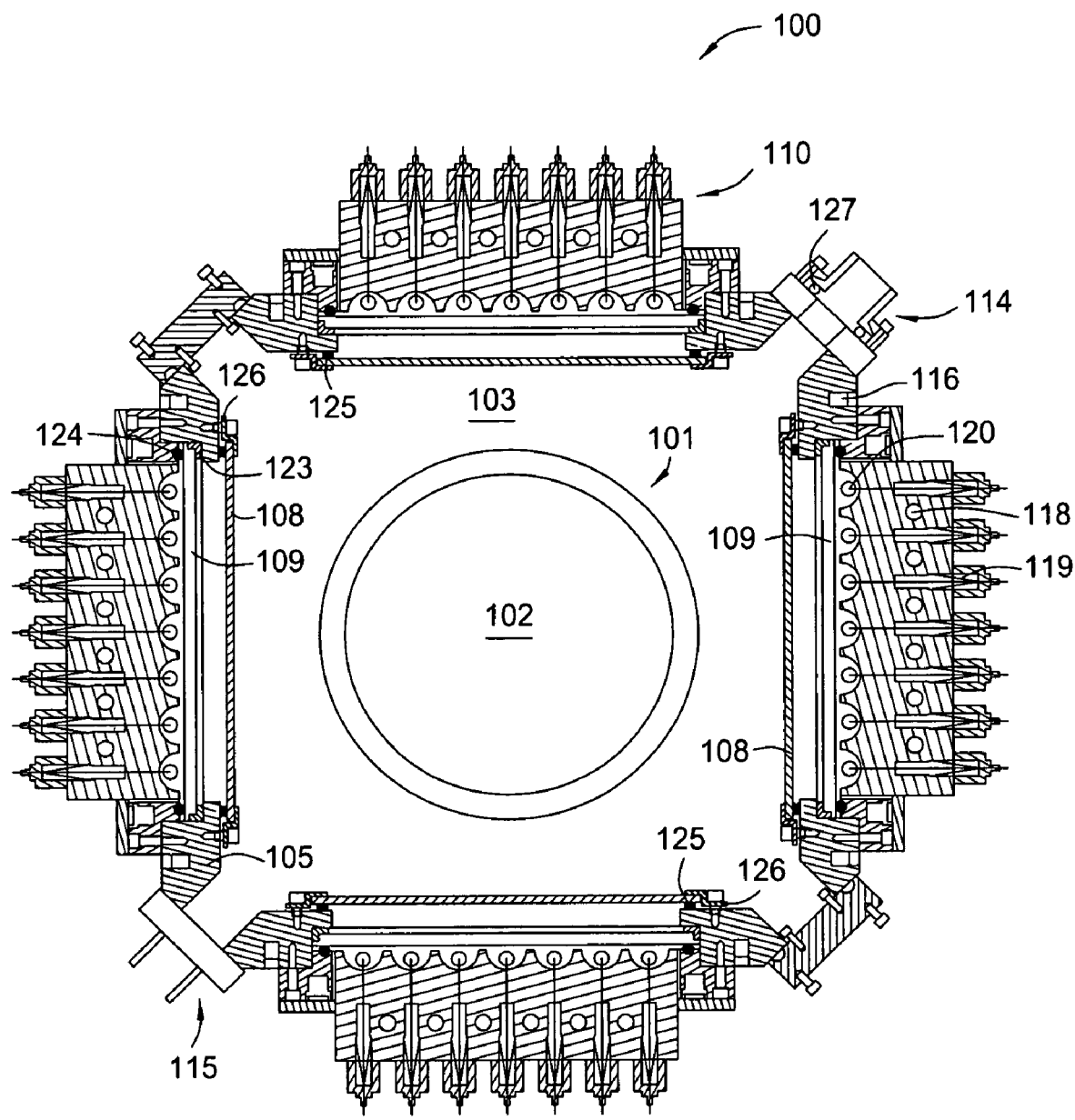
FIG. 2 illustrates a sectional side view the processing system of FIG. 1.
Figure 3:
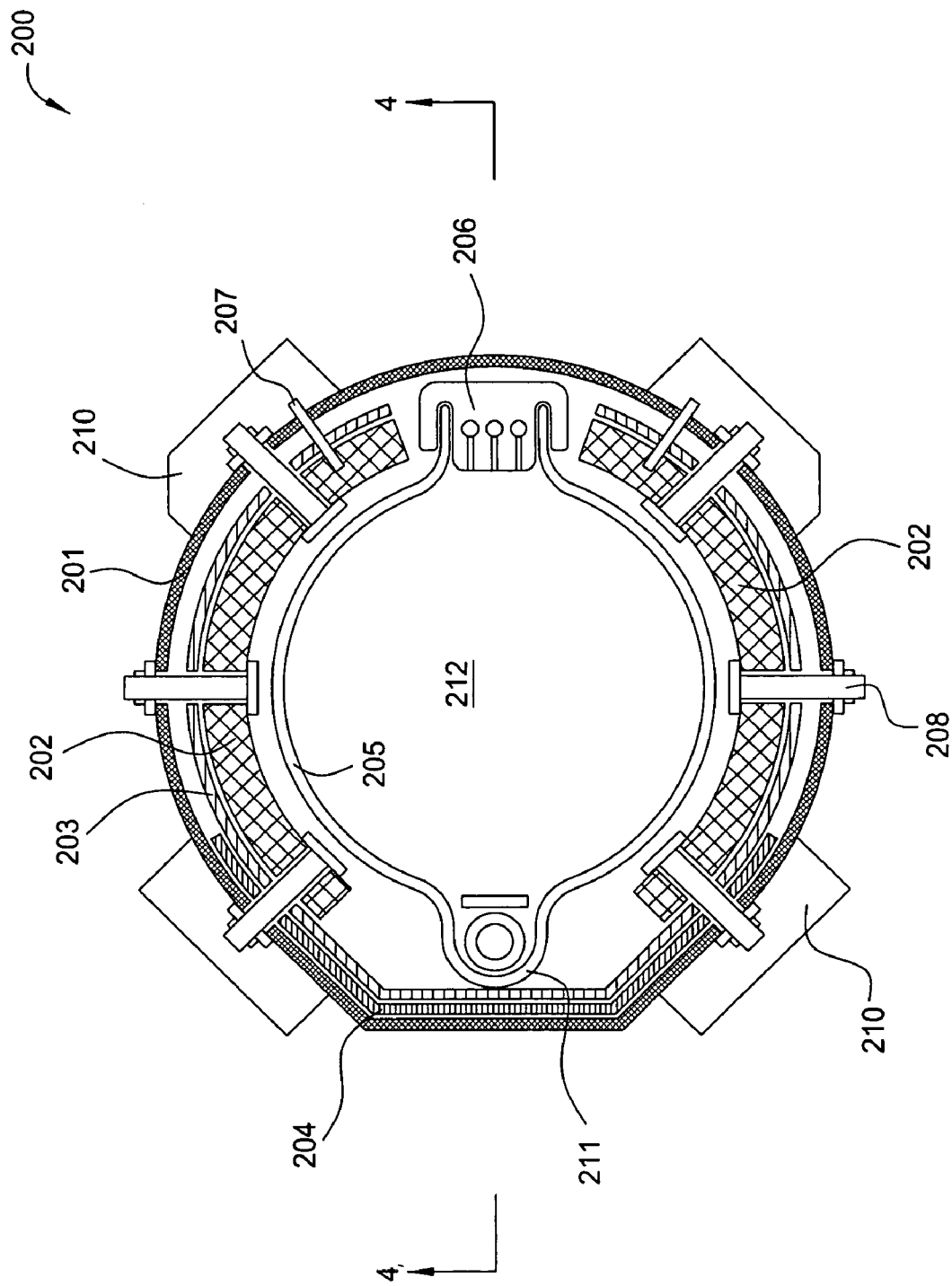
FIG. 3 is a sectional top view of an exemplary processing system in accordance with the present invention.
Figure 4:
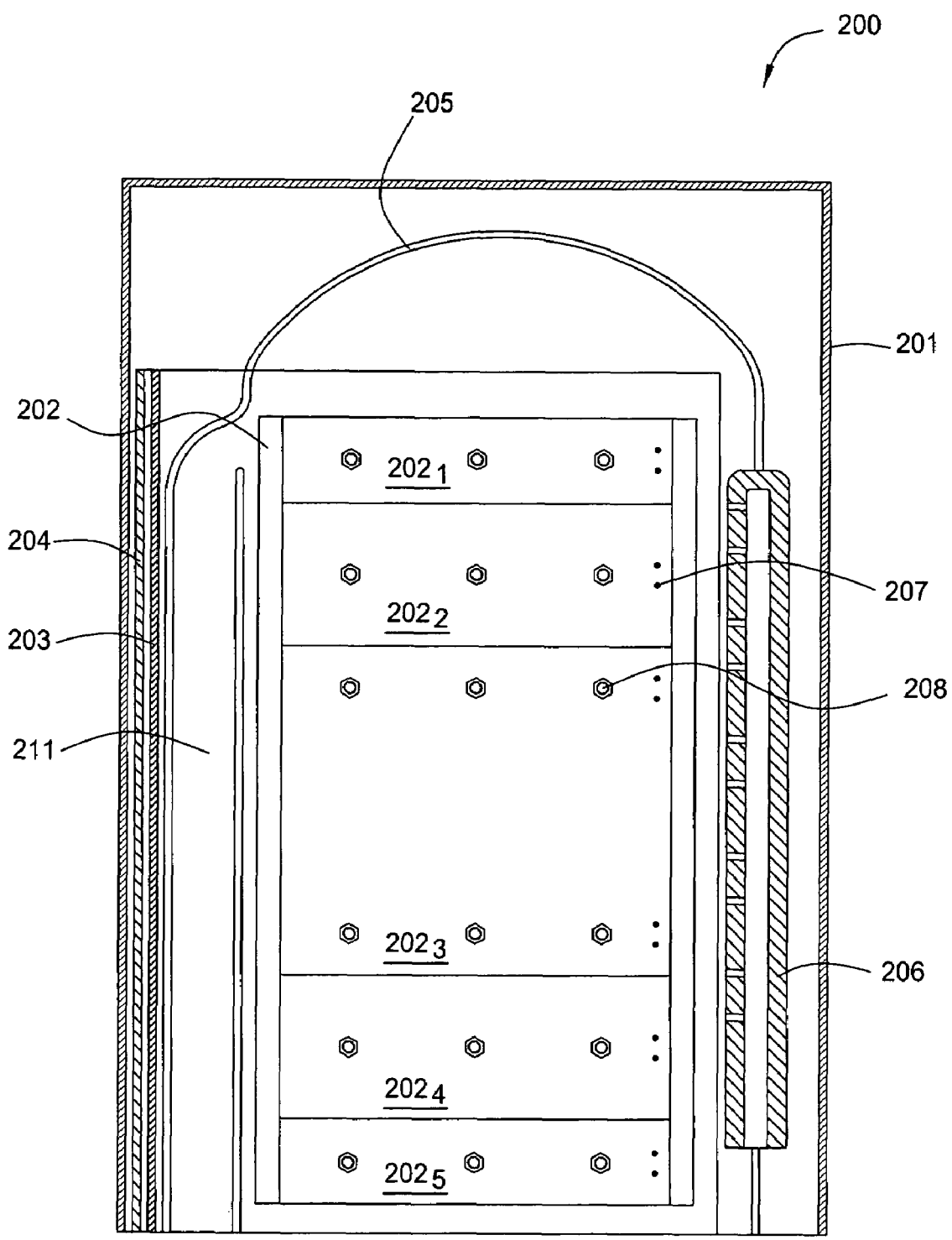
FIG. 4 is a sectional side view of the exemplary substrate processing system of FIG. 3.

FIGS. 3 and 4 illustrate one embodiment of a semiconductor processing system 200 of the present invention. The semiconductor processing system 200 may be configured to process a batch of substrate in an elevated temperature, for example to perform an atomic layer deposition (ALD) or chemical vapor deposition (CVD).

The semiconductor processing system 200 comprises a processing chamber 205 configured to process on or more substrates in an inner volume 212 enclosed therein. In one embodiment, the processing chamber 205 may be a cylindrical quartz chamber. The processing chamber 205 may have an exhaust port 211 positioned in one side and an inlet port 206 positioned in an opposite side of the exhaust port 211. The inlet port 206 is configured to supply one or more processing gas into the inner volume 212 of the processing chamber 205. The exhaust port 211 is generally adapted to a vacuum source and configured to pump processing gases from the inner volume 212. The substrates being processed may be disposed in a substrate boat in a vertically stacked manner and are generally rotated during the process to be acquire uniform exposure to heat and processing gases. A detailed description of the processing chamber 205 may be found in a co-pending U.S. patent application Ser. No. 11/249,555, filed on Oct. 13, 2005, entitled "Reaction Chamber with Opposing Pockets for Injection and Exhaust", which is incorporated herein as reference.

A heater 202 is disposed outside the processing chamber 205 and configured to heat the processing chamber 205 during process. The heater 202 may be a resistive heater. In one embodiment, the heater 202 may have substantially the same shape as the processing chamber 205 to provide a uniform heating effect around a circumference of the processing chamber 205. The heater 202 comprises multiple independently controlled zones to achieve desired heating profile, for example a uniform heating along vertical level. In one embodiment, the heater 202 may comprise multiple independently controlled zones $202_i$ (where i=1, 2, . . . n) that are vertically stacked together, as shown in FIG. 4. During a batch processing, substrates positioned near the top and the bottom of the substrate boat are usually less heated than the substrates positioned near the center of the substrate boat resulting in different processing effects among a batch of substrates. The vertically stacked configuration is particularly useful in reducing or eliminating uneven heating at different vertical levels inside the inner volume 212 in the processing chamber 205. Other configurations of the multiple zones, such as vertical zones, combination of vertical and horizontal zones, and zones corresponding to thermal profile of the processing chamber 205, may also be contemplated by the present invention.

Figure 5A:
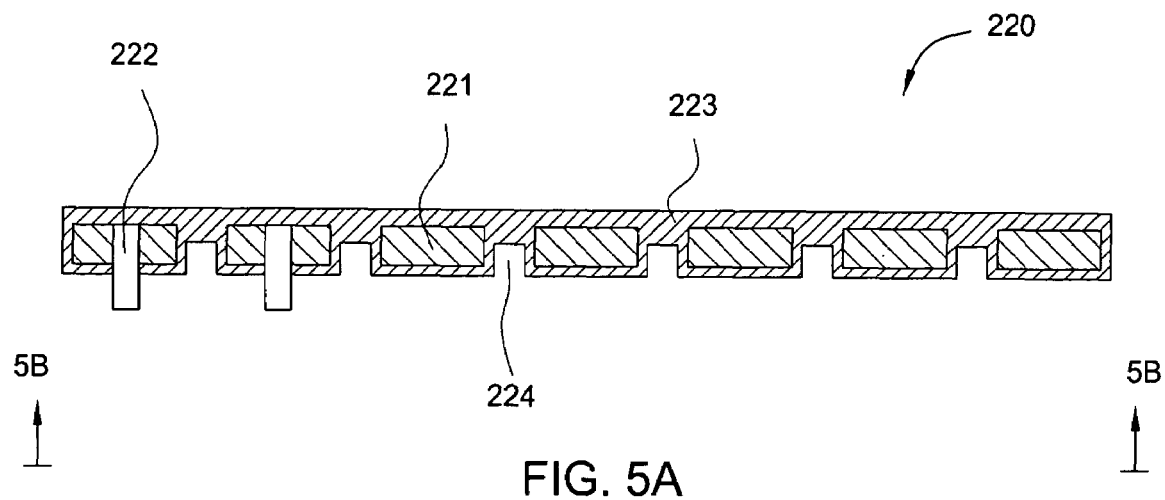
FIG. 5A is a schematic sectional view of a heating element in accordance with the present invention.
Figure 5B:
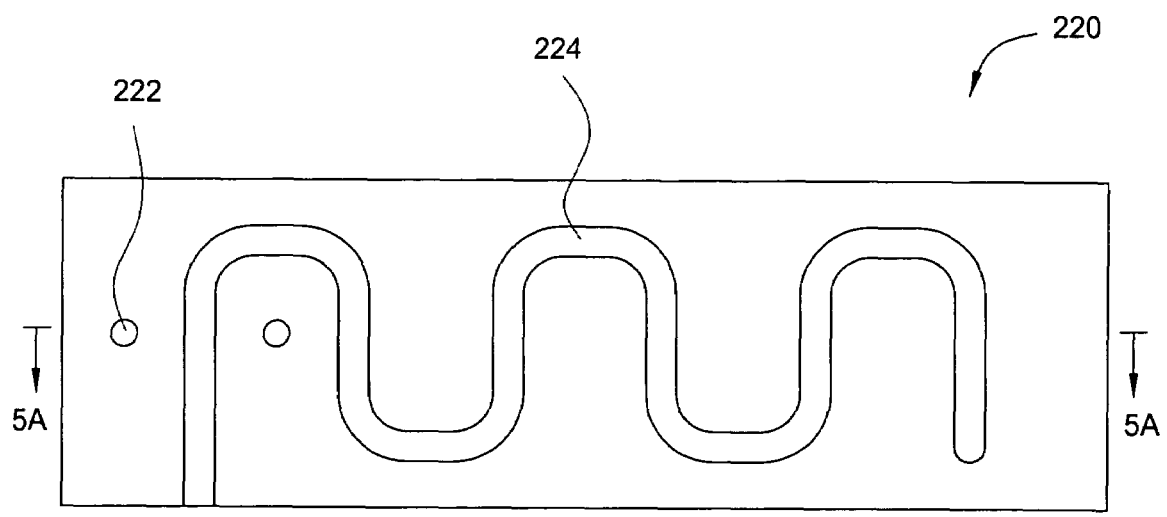
FIG. 5B is a schematic back view of the heating element of FIG. 5A.

In one embodiment, the heater 202 may be formed by a plurality of resistive heating elements. FIG. 5A illustrates a schematic sectional view of a heating element 220 that may be used to form the heater 202 of the FIGS. 3 and 4. FIG. 5B illustrates a backside (the side usually positioned away from heating target) view of the heating element 220. In one embodiment, the heating element 220 may be manufactured from a graphite disk, or graphite material of other shape. A layer of pyrolytic boron nitride (PBN) is first coated on the graphite disk. The coated graphite disk is then machined to a desired pattern from the back side. Another coat of pyrolytic boron nitride. As shown in FIGS. 5A and 5B, a channel 224 is machined on a graphite disk defining a resistive element 221 of the heating element 220. A layer of pyrolytic boron nitride coat 223 serves as an insulating material of the heating element 220. Pyrolytic boron nitride is anisotropic high temperature ceramic which has high electric resistance and good thermal conductivity. The heating element 220 may be connected to a power source via graphite posts 222. The heating element 220 is chemically inert to most gases and liquids, mechanically and thermally uniform, shock resistance, with ultra fast response. Different designs of the resistive element 221 provide different heating effect to the heating element 220. Therefore, the heater 202 made of one or more heating elements 220 may also have the flexibility of forming one or more zones of different heating effects. It should be noted that other suitable type of heating elements, such as other ceramic heaters, may also be used to form the heater 202.

Referring to FIG. 4, each of the independently controlled zones $202_i$ may comprise at least one heating element, such as the heating element 220 of FIG. 5. Each of the independently controlled zones $220_i$ may be connected to an individually controlled power source via a pair of graphite posts 207.

Referring to FIG. 3, the semiconductor processing system 200 further comprises an outer shell 201 configured to enclose the heater 202 therein. The outer shell 201 may be a metal shell. In one embodiment, the outer shell 201 may be made from stainless steel and may have a thickness of about 1.5 mm. In one embodiment, the outer shell 201 may have several feet 210 configured to secure the semiconductor processing system 200 to a base or a load lock. The heater 202 may be secured to the outer shell 201. In one embodiment, the heater 202 may be fastened to the outer shell 201 by a plurality of bolts and nuts 208. In another embodiment, the heater 202 may be directly secured to a base to which the semiconductor processing system 200 is attached.

A reflector 203 may be disposed between the heater 202 and the outer shell 201. The reflector 203 is configured to reflect radiation heat back to the heater 202 and keep the outer shell 201 from getting hot. The reflector 203 may be made from metal, such as hastelloy or stainless steel. In one embodiment, a second reflector 204 may be positioned near the exhaust port 211.

In one embodiment, the heater 202 may comprise two arced sections surrounding the processing chamber 205 and leaving the exhaust port and the inlet port uncovered. In one embodiment, the two arced sections may have the same zone configuration and counter part zones may be connected to each other forming an all around controlled zone.

Figure 6:
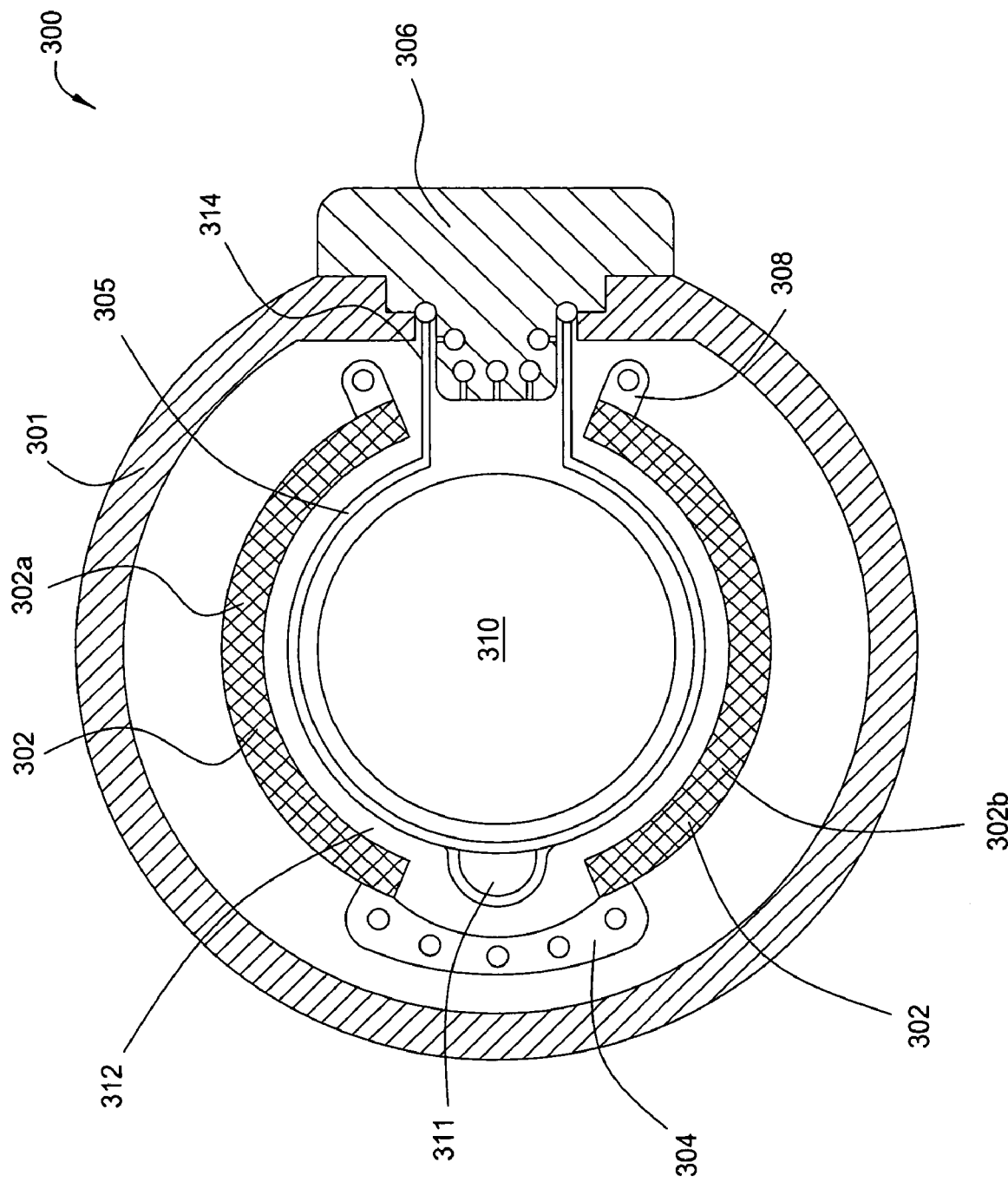
FIG. 6 is a top view of an exemplary processing system in accordance with the present invention.
Figure 7:
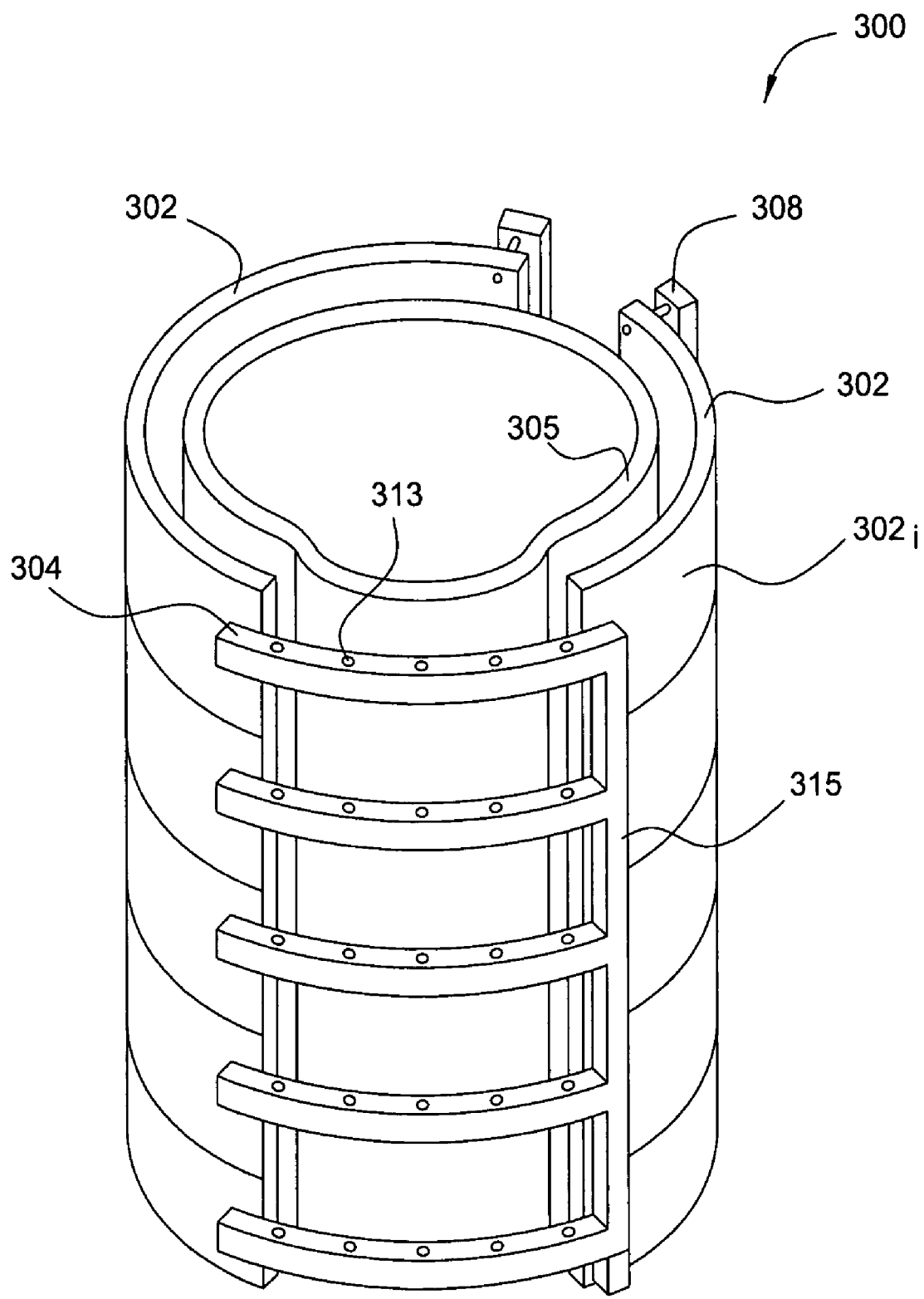
FIG. 7 is a perspective view of the processing system of FIG. 6.

FIGS. 6 and 7 schematically illustrate another embodiment of a semiconductor processing system 300 in accordance with the present invention. The semiconductor processing system 300 comprises a processing chamber 305 defining an inner volume 312 configured to process one or more substrates 310 positioned therein. The processing chamber 305 having an exhaust port 311 positioned in one side and an inject port 306 positioned on an opposite side of the exhaust port 311. The semiconductor processing system 300 further comprises an outer shell 301 surrounding the processing chamber 305. The inject port 306 may be sealed against an opening 314 formed in the outer shell 301.

A heater 302 is disposed inside the outer shell 301 and outside the processing chamber 305. The heater 302 is configured to heat the processing chamber 305. In one embodiment, the heater 320 has a substantial similar shape as the processing chamber 305 wrapping around the processing chamber 305. In one embodiment, the heater 302 may comprise two heater sections 302a and 302b leaving the exhaust port 311 and the inject port 306 uncovered.

FIG. 7 illustrates the semiconductor processing system 300 without the outer shell 301. The two heater sections 302a and 302b may be connected by one or more brackets 304. On or more graphite posts 313 may be positioned in the brackets 304 and configured to connect the heater sections 302a and 302b electronically. Each of the heater section 302a and 302b may further comprise one or more individually controlled zones 302$_i$. In one embodiment, the individually controlled zones 302$_i$ may be vertically stacked. The heater sections 302a and 302b may have identical configuration hence forming individually controlled zones at different vertical level across the processing chamber 305.

Each of the one or more individually controlled zones 302$_i$ may have one or more heating elements, such as the heating elements 220 shown in FIG. 5.

The one or more brackets 304 may be connected together by a post 315. One or more posts 308 may be also attached to the heater sections 302a and 302b. The posts 315 and 308 may be further secured to a base hence securing the heater 302.

While the foregoing is directed to embodiments of the present invention, other and further embodiments of the invention may be devised without departing from the basic scope thereof, and the scope thereof is determined by the claims that follow.

The invention claimed is:

1. A furnace for heating a semiconductor processing chamber, comprising:
   a heater surrounding side walls of the semiconductor processing chamber, wherein the heater comprises a plurality of heating elements connected in at least two independently controlled zones, and the plurality of heating elements are printed circuit heaters, wherein the printed circuit heaters comprises pyrolytic boron nitride as an insulating substrate and graphite as a resistive element; and
   a shell surrounding the heater, wherein the heater is secured to the shell.

2. The furnace of claim 1, wherein each of the plurality of heating elements is connected to a respective power source via graphite posts coated with pyrolityic boron nitride.

3. The furnace of claim 1, wherein the at least two independently controlled zones are vertically stacked.

4. The furnace of claim 1, wherein each of the at least two independently controlled zones comprises at least two of the plurality of heating elements.

5. The furnace of claim 1, wherein the heater has a substantially cylindrical shape configured to heat the semiconductor processing chamber.

6. The furnace of claim 5, wherein the semiconductor processing chamber has a vertical exhaust port and the heater has an opening opposing the vertical exhaust port.

7. A semiconductor processing system, comprising:
   a chamber for processing substrates therein;
   a heater surrounding side walls of the chamber, wherein the heater has multiple independently controlled zones;
   a shell covering the heater; and
   a first reflector element disposed between the heater and the shell, wherein the heater, the first reflector element, and the shell are secured together.

8. The system of claim 7, wherein each of the multiple independently controlled zones of the heater comprise at least one printed circuit heating element using pyrolytic boron nitride as an insulating substrate and graphite as an resistive element.

9. The system of claim 7, wherein the multiple independently controlled zones are vertically stacked.

10. The system of claim 7, wherein the chamber is a cylindrical quartz chamber having an vertical exhaust port exposed by the heater.

11. The system of claim 10, further comprising a second reflector element disposed near the vertical exhaust port and secured between the heater and the shell.

12. A furnace for a semiconductor processing chamber, comprising:
    a printed circuit heater having multiple independently controlled zones configured to heat the semiconductor processing chamber;
    a reflector disposed outside the printed circuit heater; and
    a shell disposed outside the reflector, wherein the printed circuit heater, the reflector, and the shell are secured together.

13. The furnace of claim 12, wherein the multiple independently controlled zones are vertically stacked.

14. The furnace of claim 12, wherein the printed circuit heater comprises a plurality of heating elements using pyrolytic boron nitride as an insulating substrate and graphite as resistive elements.

15. The furnace of claim 14, wherein each of the plurality of heating elements is connected to a respective power source via one or more graphite posts coated with pyrolytic boron nitride.

16. A furnace for heating a semiconductor processing chamber, comprising:
    a heater surrounding side walls of the semiconductor processing chamber, wherein the heater comprises a plurality of heating elements connected in at least two independently controlled zones;
    a shell surrounding the heater, wherein the heater is secured to the shell; and
    a first reflector element disposed between the shell and the heater.

17. The furnace of claim 16, wherein the first reflector is made of HASTELLOY metal.

18. The furnace of claim 16, further comprising a second reflector element surrounding an exhaust port area of the semiconductor processing chamber.

19. A furnace for heating a semiconductor processing chamber, comprising:

a heater surrounding side walls of the semiconductor processing chamber, wherein the heater comprises a plurality of heating elements connected in at least two independently controlled zones, and each of the plurality of heating elements comprises graphite resistive elements insulated in pyrolytic boron nitride; and a shell surrounding the heater, wherein the heater is secured to the shell and the shell is made of stainless steel.

* * * * *